(12) United States Patent
Yamazaki et al.

(10) Patent No.: US 10,611,693 B2
(45) Date of Patent: Apr. 7, 2020

(54) POLYCRYSTALLINE DIELECTRIC THIN FILM AND CAPACITOR ELEMENT

(71) Applicant: TDK CORPORATION, Tokyo (JP)

(72) Inventors: Kumiko Yamazaki, Tokyo (JP); Hiroshi Chihara, Tokyo (JP); Yuki Nagamine, Tokyo (JP); Junichi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/068,762

(22) PCT Filed: Feb. 1, 2017

(86) PCT No.: PCT/JP2017/003577
§ 371 (c)(1),
(2) Date: Jul. 9, 2018

(87) PCT Pub. No.: WO2017/135294
PCT Pub. Date: Aug. 10, 2017

(65) Prior Publication Data
US 2019/0023616 A1    Jan. 24, 2019

(30) Foreign Application Priority Data

Feb. 1, 2016    (JP) .................................. 2016-017473

(51) Int. Cl.
*C04B 35/58* (2006.01)
*H01G 4/33* (2006.01)
(Continued)

(52) U.S. Cl.
CPC ...... *C04B 35/58007* (2013.01); *C04B 35/462* (2013.01); *C04B 35/465* (2013.01);
(Continued)

(58) Field of Classification Search
CPC .............. C04B 35/58007; C04B 35/50; C04B 2235/3895; C04B 2235/602;
(Continued)

(56) References Cited

U.S. PATENT DOCUMENTS

| | | |
|---|---|---|
| 4,734,390 A | 3/1988 | Marchand et al. |
| 2013/0003254 A1 | 1/2013 | Koutsaroff et al. |
| 2015/0228408 A1 | 8/2015 | Koutsaroff et al. |

FOREIGN PATENT DOCUMENTS

| | | |
|---|---|---|
| CN | 102858691 A | 1/2013 |
| JP | S61-122108 A | 6/1986 |

(Continued)

OTHER PUBLICATIONS

Marozau et al. Pulsed laser deposition and characterisation of perovskite-type LaTiO3xNx thin films. Acta Materialia 59 (2011) 7145-7154.*

(Continued)

*Primary Examiner* — Noah S Wiese
(74) *Attorney, Agent, or Firm* — Oliff PLC (57) ABSTRACT

A polycrystalline dielectric thin film and capacitor element has a small dielectric loss tan δ. The polycrystalline dielectric thin film, in which the main composition is a perovskite oxynitride. The perovskite oxynitride is expressed by the compositional formula $A_a B_b O_o N_n$ ($a+b+o+n=5$), where $a/b>1$ and $n \geq 0.7$.

8 Claims, 6 Drawing Sheets

(51) Int. Cl.
*H01B 3/10* (2006.01)
*C04B 35/465* (2006.01)
*H01B 3/02* (2006.01)
*H01G 4/08* (2006.01)
*C04B 35/495* (2006.01)
*C04B 35/462* (2006.01)
*C04B 35/50* (2006.01)
*C04B 35/626* (2006.01)
*C04B 35/634* (2006.01)
*C04B 35/64* (2006.01)
*H01G 4/12* (2006.01)
*H01L 49/02* (2006.01)
*H01G 4/008* (2006.01)

(52) U.S. Cl.
CPC .......... *C04B 35/495* (2013.01); *C04B 35/50* (2013.01); *C04B 35/58014* (2013.01); *C04B 35/6262* (2013.01); *C04B 35/6264* (2013.01); *C04B 35/62655* (2013.01); *C04B 35/62695* (2013.01); *C04B 35/63416* (2013.01); *C04B 35/64* (2013.01); *H01B 3/02* (2013.01); *H01B 3/10* (2013.01); *H01G 4/085* (2013.01); *H01G 4/1209* (2013.01); *H01G 4/1227* (2013.01); *H01G 4/1254* (2013.01); *H01G 4/33* (2013.01); *H01L 28/55* (2013.01); *C04B 2235/3201* (2013.01); *C04B 2235/3208* (2013.01); *C04B 2235/3213* (2013.01); *C04B 2235/3215* (2013.01); *C04B 2235/3224* (2013.01); *C04B 2235/3227* (2013.01); *C04B 2235/3229* (2013.01); *C04B 2235/3251* (2013.01); *C04B 2235/3258* (2013.01); *C04B 2235/3895* (2013.01); *C04B 2235/602* (2013.01); *C04B 2235/606* (2013.01); *C04B 2235/6567* (2013.01); *C04B 2235/6583* (2013.01); *C04B 2235/768* (2013.01); *C04B 2235/77* (2013.01); *C04B 2235/79* (2013.01); *C04B 2235/96* (2013.01); *H01G 4/008* (2013.01); *H01L 28/60* (2013.01)

(58) Field of Classification Search
CPC ...... C04B 2235/6583; C04B 2235/768; C04B 2235/96; H01G 4/1209; H01G 4/1254; H01G 4/33; H01B 3/00
See application file for complete search history.

(56) References Cited

FOREIGN PATENT DOCUMENTS

| JP | 2013-001625 A | 1/2013 |
| JP | 5673796 B2 | 2/2015 |
| WO | 2015/025753 A1 | 2/2015 |

OTHER PUBLICATIONS

Ziani et al. Structural and dielectric properties of oxynitride perovskite LaTiOxNy thin films. Thin Solid Films 517 (2008) 544-549.*

Aug. 7, 2018 International Preliminary Report on Patentability issued in International Patent Application No. PCT/JP2017/003577.

Apr. 25, 2017 International Search Report issued in International Patent Application No. PCT/JP2017/003577.

Oka et al; "Possible ferroelectricity in perovskite oxynitride SrTaO2N epitaxial thin films;" Scientific Reports; vol. 4; pp. 1-6; May 16, 2014.

Hirose et al; "Epitaxial Growth of Perovskite Oxynitride CaTaO2N Thin Film;" Kast Annual Research Report, 2013; pp. 32-33; Aug. 26, 2014.

Marozau et al; "Pulsed laser deposition and characterisation of perovskite-type LaTiO3-xNx thin films;" Acta Materialia; vol. 59; pp. 7145-7154; Aug. 12, 2011.

* cited by examiner

POLYCRYSTALLINE DIELECTRIC THIN FILM AND CAPACITOR ELEMENT

TECHNICAL FIELD

The present invention relates to a polycrystalline dielectric thin film and a capacitor element.

RELATED ART

In accordance with miniaturization and high performance of digital equipment, capacitor elements using high-performance dielectric thin films have been required.

Thin films using a metal oxide material are conventionally widely used as dielectric thin films. The improvement of characteristics of the dielectric thin films by the metal oxide material has been, however, reaching its limit, and new materials having higher characteristics are required. One of candidates of the new materials is a metal oxynitride material where some of oxygen atoms in an oxygen octahedron having a perovskite crystal structure are substituted with nitrogen atoms, but it is difficult to obtain a dielectric thin film having a metal oxynitride material.

For example, Patent Document 1 and Patent Document 2 disclose a method of manufacturing a powder of perovskite-type oxynitride $ABO_2N$, but Patent Document 1 and Patent Document 2 do not disclose that a thin film using perovskite-type oxynitride $ABO_2N$ is obtained.

Non-Patent Document 1 and Non-Patent Document 2 disclose that a thin film comprising perovskite-type oxynitride $ABO_2N$ is manufactured, but the thin films obtained in Non-Patent Document 1 and Non-Patent Document 2 are epitaxial films.

The epitaxial film refers to a thin film manufactured by an epitaxial growth. The epitaxial growth is one of thin film crystal growth techniques, and refers to a crystal growth where a crystal growth is carried out on crystals to be a substrate and is aligned to the crystal face of the underlying substrate.

The epitaxial film is disadvantageous in that it takes a very long time to manufacture the epitaxial film.

PATENT DOCUMENT

Patent Document 1: Japanese Laid-Open Patent Publication No. S61-122108
Patent Document 2: Japanese Laid-Open Patent Publication No. 2013-001625

Non-Patent Document

Non-Patent Document 1: Scientific Reports 4. DOI: 10.1038/srep04987
Non-Patent Document 2: KAST Annual Research report, 2013, 32-33.

SUMMARY OF THE INVENTION

Problems to be Solved by the Invention

The present invention has been achieved under such circumstances. It is an object of the invention to provide a polycrystalline dielectric thin film and a capacitor element having high manufacturing efficiency and low dielectric loss.

Solution to Problem

A polycrystalline dielectric thin film according to the present invention comprises a main component of a perovskite-type oxynitride,
wherein the perovskite-type oxynitride is represented by a composition formula of $A_aB_bO_oN_n$ (a+b+o+n=5), and wherein a/b>1 and n≥0.7 are satisfied.

The polycrystalline dielectric thin film according to the present invention has the above features, and can thereby have a small dielectric loss.

Preferably, "A" is one or more elements selected from Sr, Ba, Ca, La, Ce, Pr, Nd, and Na, and "B" is one or more elements selected from Ta, Nb, Ti, and W.

Preferably, the polycrystalline dielectric thin film according to the present invention further comprises an octahedron structure of $BO_4N_2$, wherein an arrangement of N in the octahedron structure is mainly cis-type.

A capacitor element according to the present invention comprises the polycrystalline dielectric thin film.

MODES FOR CARRYING OUT THE INVENTION

Hereinafter, the present invention is described based on an embodiment.

Figure 1:
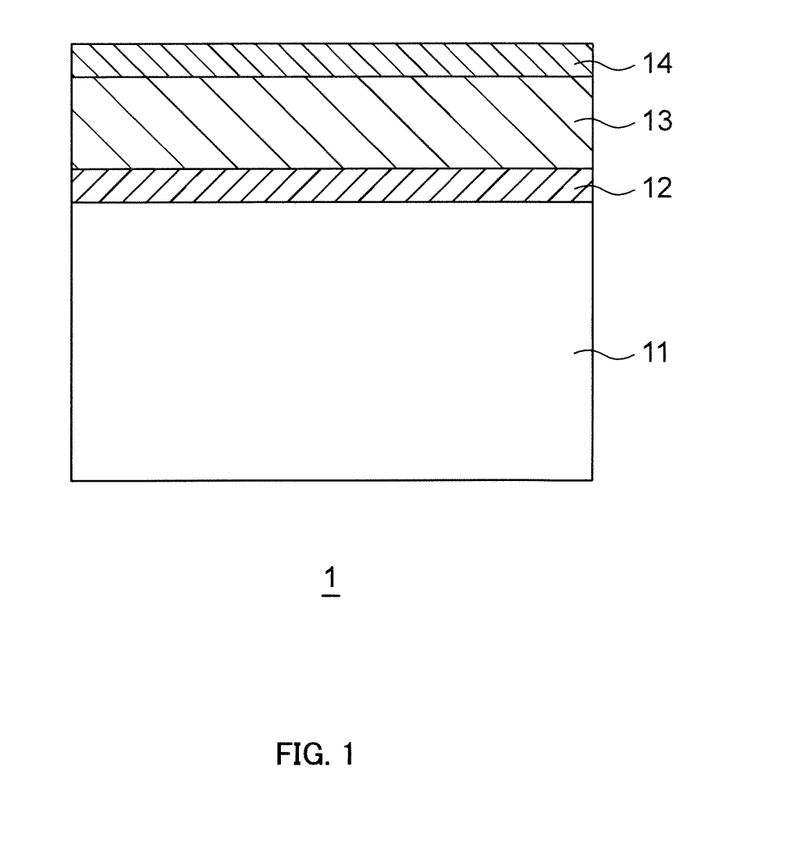
FIG. 1 is a schematic view of a thin film capacitor according to an embodiment of the present invention.

FIG. 1 shows a schematic view of a thin film capacitor according to the present embodiment. In a thin film capacitor 1 shown in FIG. 1, a lower electrode 12 and a polycrystalline dielectric thin film 13 are formed in this order on a substrate 11, and an upper electrode 14 is formed on the surface of the polycrystalline dielectric thin film 13.

The substrate 11 is made of any material, but if the substrate 11 is a Si single crystal substrate, it is excellent in availability and cost. If flexibility is considered to be important, a Ni foil may be used as the substrate.

The lower electrode 12 and the upper electrode 14 are made of any materials that allow them to work as an electrode, such as Pt, Ag, Ni, etc. Preferably, the lower electrode 12 has a thickness of 0.01 to 10 µm. Preferably, the upper electrode 14 has a thickness of 0.01 to 10 µm.

The polycrystalline dielectric thin film 13 is a polycrystalline dielectric thin film having a main component of a perovskite-type oxynitride.

The perovskite-type oxynitride can be represented by a composition formula of $A_aB_bO_oN_n$ (a+b+o+n=5), where "A" is A-site ions of the perovskite-type oxynitride, and "B" is B-site ions of the perovskite-type oxynitride.

Preferably, "A" is one or more elements selected from Sr, Ba, Ca, La, Ce, Pr, Nd, and Na. "A" is more preferably one or more elements selected from Sr, Ba, La, and Nd because high capacitance can be obtained, and "A" is the most preferably Sr. Preferably, "B" is one or more elements selected from Ta, Nb, Ti, and W. "B" is more preferably one or more elements selected from Ta and Ti because a polycrystalline dielectric thin film 13 having less different phases can be obtained, and "B" is the most preferably Ta.

Moreover, a/b>1 and n≥0.7 are preferably satisfied. More preferably, a/b≥1.05 is satisfied. More preferably, n≥0.8 is satisfied. When "a/b" and "n" are in the above ranges, tan δ can be good.

In the perovskite-type oxynitride, a total of an average valence of A-site ions and an average valence of B-site ions is 6.7 to 7.3, preferably 7.

Here, the average valence refers to an averaged value of valences of ions present in the A-site and B-site based on their abundance ratio. For example, there is a case where Sr and La are present by 4:1 in the A-site and Ta and Ti are present in the B-site by 4:1. The valence of Sr ions is two, and the valence of La ions is three. Thus, α is calculated by Formula (1) below, where α is the average valence of Sr and La in this case. Moreover, the valence of Ta ions is five, and the valence of Ti ions is four. Thus, β is calculated by Formula (2) below, where β is the average valence of Ta and Ti in this case. Then, α=2.2 and β=4.8 are satisfied, and the total (α+β) of these average valences is seven.

$$\alpha = \text{(valence of Sr ions)} \times \text{(abundance ratio of Sr ions)} + \text{(valence of La ions)} \times \text{(abundance ratio of La ions)}$$
$$= 2 \times 4/5 + 3 \times 1/5$$
$$= 2.2$$

Formula (1)

$$\beta = \text{(valence of Ta ions)} \times \text{(abundance ratio of Ta ions)} + \text{(valence of Ti ions)} \times \text{(abundance ratio of Ti ions)}$$
$$= 5 \times 4/5 + 4 \times 1/5$$
$$= 4.8$$

Formula (2)

Incidentally, a total of average valences of the present application is calculated with a/b=1 when having A-site rich or B-site rich, that is, even if having a/b≠1. In the above case, for example, the total of average valences is 2.2+4.8=7 even if having a/b=1.2.

Hereinafter, an example where the perovskite-type oxynitride is $Sr_aTa_bO_oN_n$ is described, but this example also applies to a case where A-site element and/or B-site element is/are different element(s).

Preferably, the polycrystalline dielectric thin film 13 has an octahedral structure of $BO_4N_2$, and an arrangement of N in the octahedral structure is mainly cis-type.

Figure 2A:
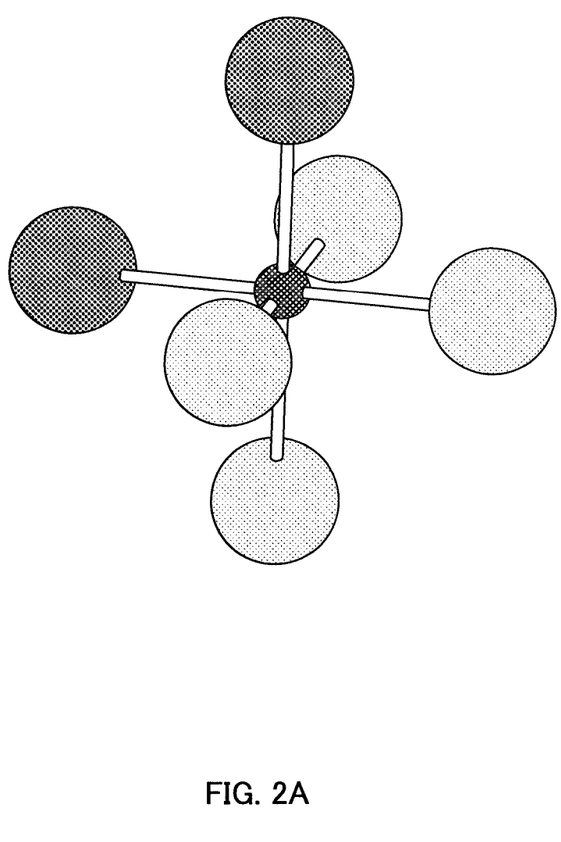
FIG. 2A is a schematic view showing a case where an arrangement of N is cis-type.
Figure 2B:
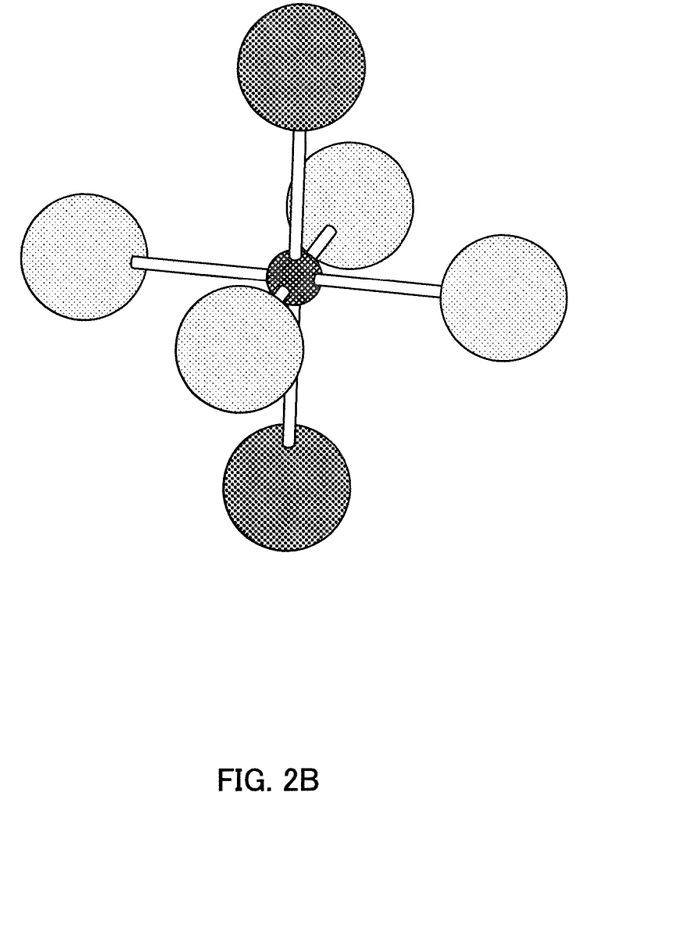
FIG. 2B is a schematic view showing a case where an arrangement of N is trans-type.

Now, a structure where N takes a cis arrangement is a structure where two Ns are arranged adjacent to each other as shown in FIG. 2A. On the other hand, a structure where N takes a trans arrangement is a structure where two Ns are not adjacent to each other as shown in FIG. 2B.

Figure 3A:
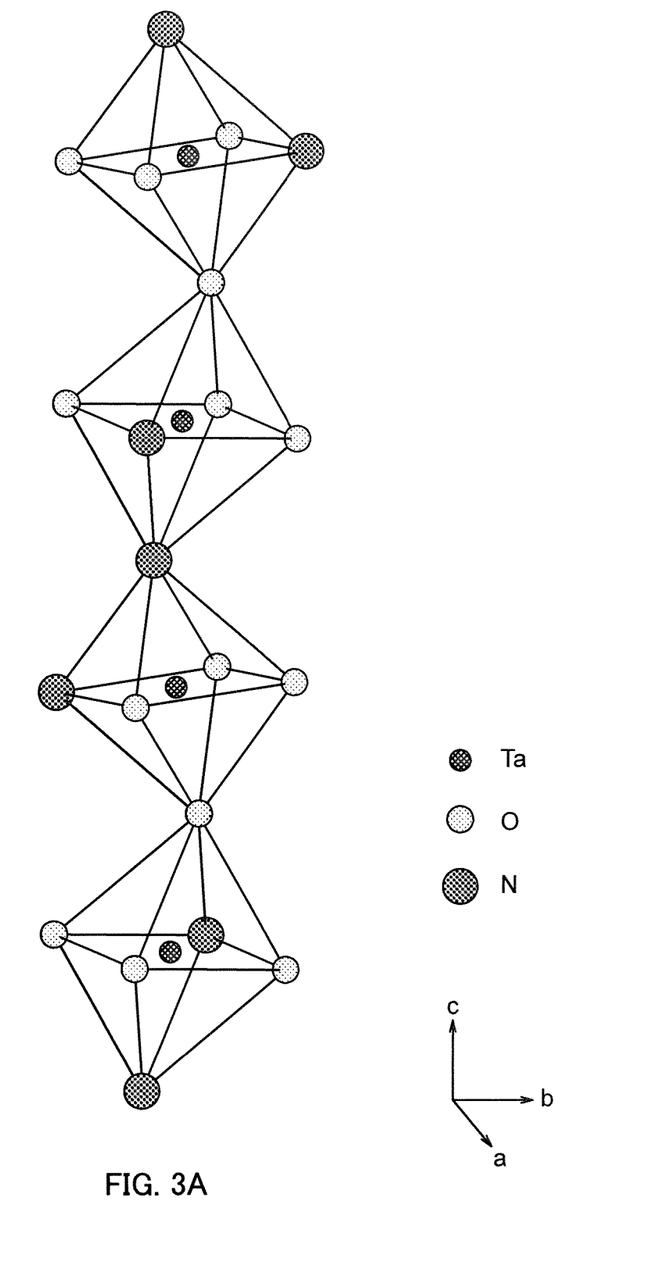
FIG. 3A is a schematic view showing a case where an arrangement of N is cis-type.
Figure 3B:
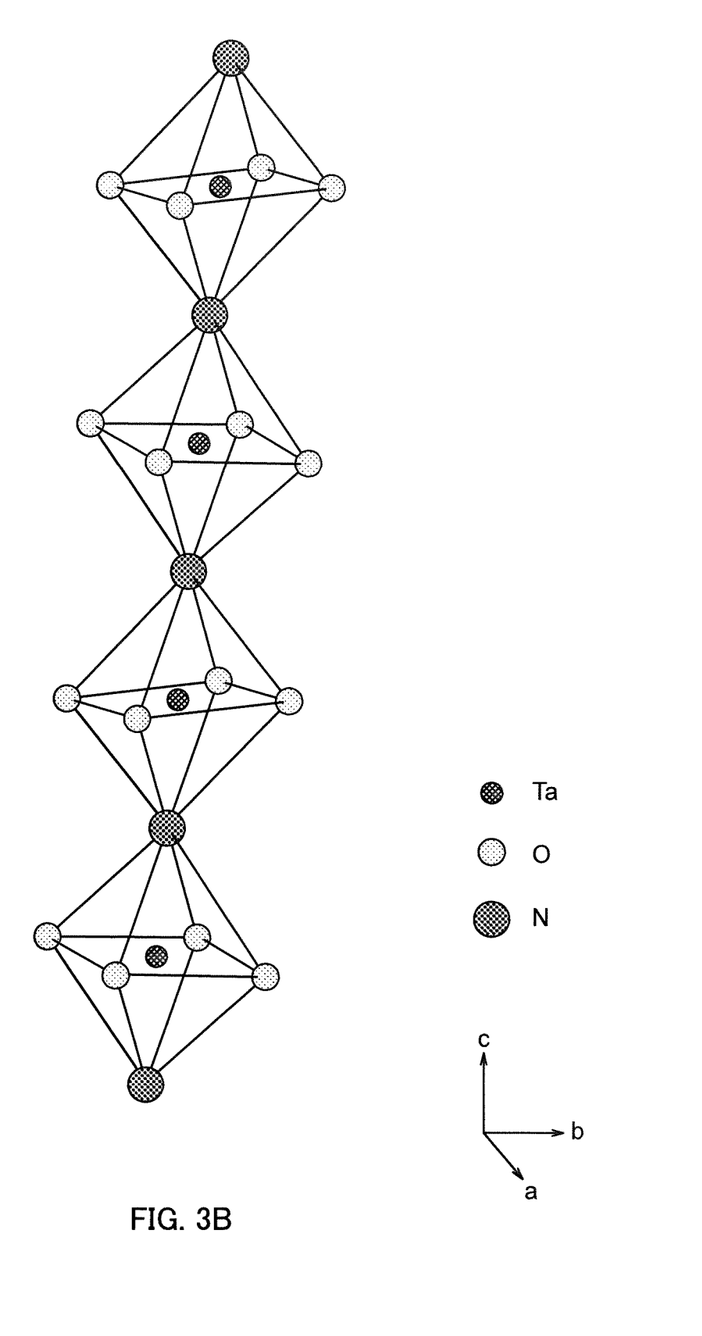
FIG. 3B is a schematic view showing a case where an arrangement of N is trans-type.

For each case of a cis arrangement of N and a trans arrangement of N, FIG. 3A and FIG. 3B illustrate that a plurality of octahedron structures is connected. As shown in FIG. 3A, when N takes a cis arrangement, the crystals are connected in a zigzag manner in the c-axis direction. On the other hand, as shown in FIG. 3B, when N takes a trans arrangement, the crystals are connected straight in the c-axis direction. It is also understood that the c-axis length is longer when N takes a trans arrangement, compared to when N takes a cis arrangement.

In the polycrystalline dielectric thin film according to the present embodiment, a neutron diffraction can confirm that N mainly takes a cis arrangement. Even if no neutron diffraction is carried out, it is known that N takes a stable cis arrangement provided that $ABO_2N$ is polycrystalline. On the other hand, if $ABO_2N$ of trans arrangement is desired to be obtained, a special state where the trans arrangement is more stable needs to be prepared by applying a substrate stress to single crystals of $ABO_2N$, such as epitaxial growth of the substrate as shown in Non-Patent Document 1. In polycrystals mainly having a cis arrangement, however, a trans arrangement is not normally completely zero. Even if a cis structure is stable, some of N may be disordered due to thermal motion or the like, and the trans arrangement may be taken. Even in such a case, the cis structure is dominant as the overall number, and the neutron diffraction consequently obtains a result of cis structure from the existence probability of the site.

Now, the polycrystalline dielectric thin film according to the present embodiment is a thin film that is different kind from an epitaxial film. Here, when an epitaxial film having a perovskite-type oxynitride of $Sr_aTa_bO_oN_n$ is formed of a specific substrate, N takes a trans arrangement.

Figure 4:
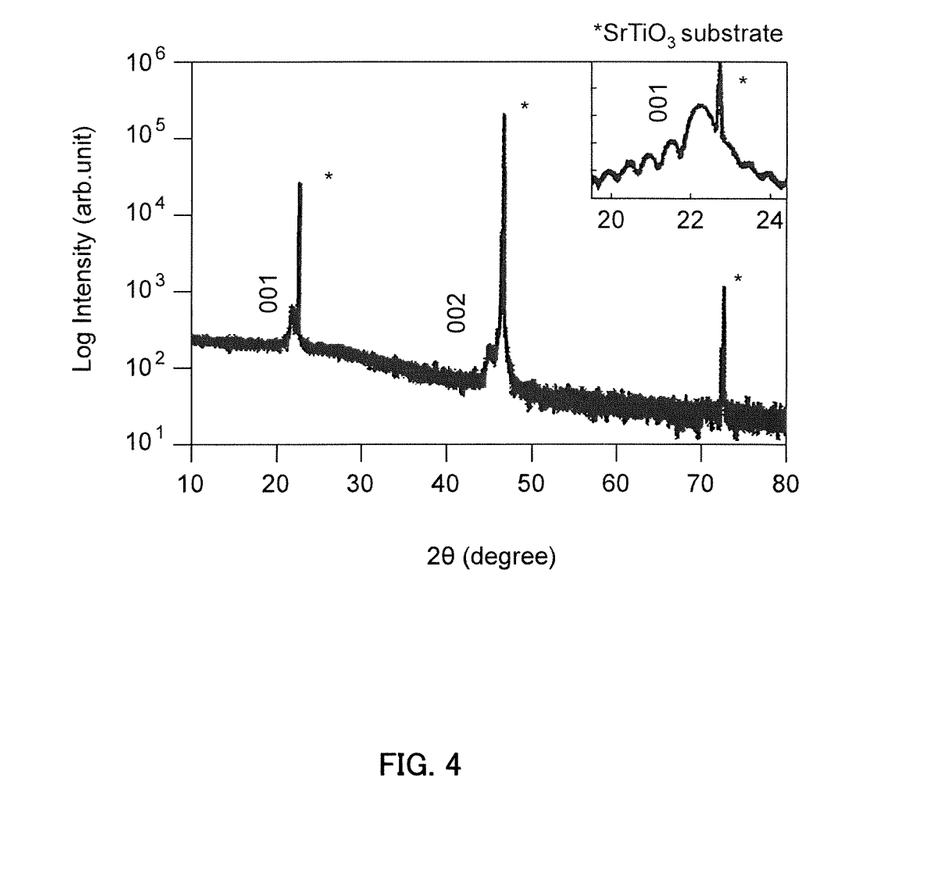
FIG. 4 is a schematic view of an XRD pattern of an epitaxial film comprising $CaTaO_2N$.

In order to confirm that the polycrystalline dielectric thin film according to the present embodiment is not an epitaxial film, an XRD data of an epitaxial film having a perovskite-type oxynitride of $SrTaO_2N$ is created, and it is confirmed that there is no common peak by comparing with an XRD data of the polycrystalline dielectric thin film according to the present embodiment. Incidentally, FIG. 4 is an XRD date of an epitaxial film having a perovskite-type oxynitride of $CaTaO_2N$. An XRD data of an epitaxial film of $SrTaO_2N$ is created similarly to FIG. 4. If there is a peak in the XRD data and if a crystal surface due to the peak is not only a specific crystal surface, it can be confirmed that a thin film is a polycrystalline film.

The polycrystalline dielectric thin film 13 is one of polycrystalline films, and is also one of dielectric thin films. The polycrystalline dielectric thin film 13 has any thickness, but preferably has a thickness of 10 nm to 1 μm.

Method of Manufacturing Thin Film Capacitor 1

Next, a method of manufacturing the thin film capacitor 1 is described. Hereinafter, A-site atom is Sr and B-site atom is Ta, but the thin film capacitor 1 is manufactured similarly even if other elements are employed.

A thin film to finally be the polycrystalline dielectric thin film 13 is formed by any method, such as vacuum deposition method, sputtering method, pulsed laser deposition method (PLD method), metal organic chemical vapor deposition method (MO-CVD), organic metal decomposition method (MOD), sol-gel method, and chemical solution deposition method (CSD). Minute impurities and auxiliary components may be contained in raw materials used for film formation, but this is not a problem so long as they do not significantly impair the performance of the thin film. Likewise, the polycrystalline dielectric thin film 13 according to the present embodiment may include minute impurities and auxiliary components so long as they do not significantly impair the performance.

If the polycrystalline dielectric thin film 13 according to the present embodiment is formed by a PLD method, a sputtering method, a CSD method, or the like among the above-mentioned methods, a thin film to be finally obtained easily becomes a polycrystalline film. If the polycrystalline dielectric thin film 13 according to the present embodiment is formed by a PLD method, a sputtering method, a CSD method, or the like, N easily takes a cis arrangement. The thin film can be formed by a CVD method, but the number of component elements is large, and a PLD method and a sputtering method thereby have higher composition controllability. In the present embodiment, a method of manufacturing the film by a PLD method is described.

First, a Si single crystal substrate is prepared as the substrate 11. Next, films of $SiO_2$, $TiO_x$, and Pt are formed in this order on the Si single crystal substrate, and the lower electrode 12 comprising Pt is formed. The lower electrode 12 is formed by any method, such as sputtering method and CVD.

Next, a metal oxide thin film is formed on the lower electrode 12 by a PLD method. For exposure of part of the lower electrode 12, a region where the thin film is not partly formed is formed using a metal mask.

In the PLD method, first, a target including constituent elements of an objective polycrystalline dielectric thin film is placed in a deposition chamber. Next, a pulse laser is irradiated against the surface of the target. The surface of the target is instantly vaporized by a strong energy of the pulse laser. Then, a metal oxide thin film is formed by depositing the vaporized product on a substrate disposed to face the target.

The target is any kind, such as alloys, nitride sintered materials, and metal oxynitride sintered materials, in addition to metal oxide sintered materials containing constituent elements of a polycrystalline dielectric thin film to be manufactured. In the target, each element is preferably homogeneously distributed, but may be distributed heterogeneously so long as the quality of a polycrystalline dielectric thin film to be obtained is not affected. Moreover, the target is not necessarily one, and a plurality of targets containing some of the constituent elements of the polycrystalline dielectric thin film may be prepared and used for formation of the thin film. The target has any shape that is suitable for a film formation device to be used. Moreover, "a/b" of a polycrystalline dielectric thin film to be finally obtained can be controlled by adjusting film formation conditions (gas pressure of oxygen, gas pressure of nitrogen, size of film formation chamber, position of gas introduction tube, etc.). For example, if "a/b" of the target is increased, "a/b" of a formed film can be increased. In addition to "a/b" of the target, the film formation conditions are also important. This is because metal elements that have been evaporated from the target by the pulse laser are affected by elements constituting the atmosphere in the film formation chamber and reach the surface of the formed film on the substrate.

For example, when a polycrystalline dielectric thin film to be finally obtained has a composition of $Sr_aTa_bO_oN_n$, a sintered material containing $Sr_2Ta_2O_7$ is prepared as a target. Then, "a/b" of the polycrystalline dielectric thin film to be finally obtained can be controlled by adjusting film formation conditions (gas pressure of oxygen, gas pressure of nitrogen, size of film formation chamber, position of gas introduction tube, etc.).

In the PLD method, the substrate 11 is preferably heated by an infrared laser during film formation for crystallization of a metal oxide thin film to be formed. The heating temperature of the substrate 11 varies based on constituent elements, composition, and the like of the metal oxide thin film and the substrate 11, but for example, the film formation is carried out by heating at 600 to 800° C. If the substrate 11 has an appropriate temperature, the metal oxide thin film is crystallized easily, and cracking generated at cooling can be prevented from occurring.

If a nitriding treatment is carried out by introducing nitrogen radical during film formation, the polycrystalline dielectric thin film 13 comprising a perovskite-type oxynitride can be obtained.

Finally, the upper electrode 14 is formed on the polycrystalline dielectric thin film 13, and the thin film capacitor 1 can be thereby manufactured. Incidentally, the upper electrode 14 is made of any material, such as Ag, Au, and Cu. Moreover, the upper electrode 14 is formed by any method, such as sputtering method.

An embodiment of the present invention is described above, but the present invention is not limited to the embodiment, and may of course be achieved in variously different embodiments within the scope not deviating the gist thereof.

Incidentally, the capacitor element according to the present invention refers to an element utilizing dielectricity, and includes a capacitor, a thermistor, a filter, a diplexer, a resonator, a transmitter, an antenna, a piezoelectric element, a transistor, a ferroelectric memory, and the like. The polycrystalline dielectric thin film according to the present embodiment is advantageously used as a capacitor element particularly requiring small dielectric loss.

EXAMPLES

Hereinafter, the present invention is described based on more detailed examples, but is not limited thereto.

Experimental Example 1

Initially, a $SrCO_3$ powder and a $Ta_2O_5$ powder were prepared as raw materials of a $Sr_2Ta_2O_7$ sintered material used as a target for film formation. The $SrCO_3$ powder and the $Ta_2O_5$ powder were weighed so that a mol ratio of Sr/Ta was 1.

Next, a mixed slurry was obtained by mixing the $SrCO_3$ powder and the $Ta_2O_5$ powder for 16 hours in a wet ball mill using an ethanol solvent.

Next, the mixed slurry was dried for 12 hours at 80° C. in a constant temperature dryer, and a mixture was obtained.

Next, the mixture was lightly crushed in a mortar and placed in a ceramic crucible. Then, the crushed mixture was heated for 2 hours at 1000° C. in an air atmosphere using an electric furnace, and a calcined product was obtained.

Next, the calcined product was once again mixed for 16 hours in a wet ball mill using an ethanol solvent, and a calcined slurry was obtained.

The resulting calcined slurry was dried for 12 hours at 80° C. in a constant temperature dryer, and a calcined mixture was obtained.

The calcined mixture was added with a polyvinyl alcohol solution as a binder and mixed, and a granulated product was obtained. The polyvinyl alcohol solution was added in an amount of 0.6 wt % with respect to 100 wt % of the granulated product.

The granulated product was molded into a column shape having a diameter of about 23 mm and a height of about 9 mm, and a molded product was obtained. The granulated product was molded by CIP molding.

The molded product was fired for 2 hours at 1400° C. in an atmosphere using an electric furnace, and a sintered product was obtained. Moreover, top and bottom surfaces of the sintered product were mirror-polished, and a film-forming target having a height of 5 mm was obtained. Incidentally, it was confirmed that the resulting film-forming target had a relative density of 96 to 98%.

The film-forming target obtained as described above was set in a film forming apparatus, and a Si substrate was placed to face the film-forming target. A Pt film as a lower electrode was on the surface of the Si substrate.

In Experimental Example 1, a thin film was formed to have a thickness of 200 nm by a PLD method. At this time, "a/b" of a polycrystalline dielectric thin film to be finally obtained was controlled by adjusting film formation conditions (gas pressure of oxygen, gas pressure of nitrogen, etc.). The polycrystalline dielectric thin film was obtained by introducing nitrogen radial and carrying out a nitriding treatment during the film formation. Incidentally, the film formation was carried out for 0.5 to 2 hours.

XRD patterns of the thin film samples obtained in Experimental Example 1 were measured using a fully automatic horizontal multi-objective X-ray diffractometer SmartLab manufactured by Rigaku Corporation. It was confirmed that all of the examples in Experimental Example 1 were not epitaxial films. Moreover, "o" and "n" of the thin film samples obtained were quantified by an impulse heating melt extraction method (infrared absorption method) using TC 600 manufactured by LECO. In addition, valence of Sr ions and valence of Ta ions were determined from XPS chemical shift, and it was confirmed that there was no change in valence from the raw materials. Specifically, the valence number of Sr ions was two, and the valence number of Ta ions was five. Also, the value of "a/b" and the value of "n" were calculated from the values quantified by the impulse heating molten extraction method.

From the XRD pattern of the thin film samples obtained in Experimental Example 1, it was confirmed that all of the examples in Experimental Example 1 had a polycrystalline film. That is, it was confirmed that the thin films were crystalized and a polycrystalline thin film. It was also confirmed that the resulting polycrystalline thin films were not an oriented film oriented to a specific plane. This was a state where a cis arrangement was stable. Incidentally, FIG. 3A does not illustrate Ta—N chains, but Ta—N chains are connected in a zigzag manner in a cis-type structure of $ABO_2N$.

Subsequently, an Ag electrode was formed on the thin film samples obtained in Experimental Example 1 by vapor deposition, and dielectric loss (tan δ) was measured.

The dielectric loss was measured with an impedance analyzer (manufactured by Agilent Technologies, Inc.) 4294A at a measurement voltage of 100 mV and a measurement frequency of 1 MHz. In the present experimental example, a tan δ of 10% or less was determined to be good. The results are shown in Table 1.

TABLE 1

|  | A-site | B-site | a/b | n | tan δ (%) |
| --- | --- | --- | --- | --- | --- |
| Comp. Ex. 1 | Sr | Ta | *0.7* | 0.8 | *40* |
| Comp. Ex. 2 | Sr | Ta | *0.9* | 0.8 | *16* |
| Ex. 1 | Sr | Ta | 1.1 | 0.8 | 1 |

According to Table 1, the tan δ was 10% or less in Example 1, where "a/b" was larger than 1, while the tan δ exceeded 10% in Comparative Examples 1 and 2, where "a/b" was 1 or less.

According to Table 1, tan δ approaches 0% as "a/b" is higher. This is a phenomenon peculiar to $ABO_2N$. According to the theoretical calculation, it is assumed that when an anion defect occurs, this defect is likely to be compensated by the A site becoming a defect. If the A-site becomes a defect, however, it is considered that dielectricity decreases and tan δ rises. It is thereby considered that A-site defects can be less likely to occur and tan δ can be smaller, by increasing "a/b" and containing A-site element more than Stoquio (a/b=1).

Experimental Example 2

Thin film samples of Example 11 and Comparative Example 11 were prepared and subjected to various measurements in the same manner as in Experimental Example 1 except that a $La_2O_3$ powder and a $TiO_2$ powder were used instead of a $SrCO_3$ powder and a $Ta_2O_5$ powder. Moreover, thin film samples of Example 12 and Comparative Example 12 were prepared and subjected to various measurements in the same manner as in Experimental Example 1 except that a BaO powder and a $Ta_2O_5$ were used. Moreover, thin film samples of Example 13 and Comparative Example 13 were prepared and subjected to various measurements in the same manner as in Experimental Example 1 except that an $Nd_2O_3$ powder and a $TiO_2$ powder were used. The results are shown in Table 2. Incidentally, the thin film samples of the examples obtained in Experimental Example 2 were subjected to an XRD measurement. From the XRD measurement, it was confirmed that all of the examples and the comparative examples in Experimental Example 2 were polycrystalline thin films, not epitaxial films, and had a cis-type arrangement of N. In Example 11 and Comparative Example 11, the valences of La ions and Ti ions were determined from the chemical shift of XPS, and it was confirmed that there was no change in valence from the raw materials. Specifically, the valence number of La ions was 3, and the valence number of Ti ions was 4. In Example 12 and Comparative Example 12, the valences of Ba ions and Ta ions were determined from the chemical shift of XPS, and it was confirmed that there was no change in valence from the raw materials. Specifically, the valence number of Ba ions was 2, and the valence number of Ta ions was 5. Moreover, in Example 13 and Comparative Example 13, the valences of Nd ions and Ti ions were determined from the chemical shift of XPS, and it was confirmed that there was no change in valence from the raw materials. Specifically, the valence number of Nd ions was 3, and the valence number of Ti ions was 4.

TABLE 2

|  | A-site | B-site | a/b | n | tan δ (%) |
| --- | --- | --- | --- | --- | --- |
| Comp. Ex. 11 | La | Ti | *0.90* | 0.9 | *50* |
| Ex. 11 | La | Ti | 1.25 | 0.9 | 1 |
| Comp. Ex. 12 | Ba | Ta | *0.80* | 1.0 | *48* |
| Ex. 12 | Ba | Ta | 1.30 | 1.0 | 5 |
| Comp. Ex. 13 | Nd | Ti | *0.90* | 0.8 | *53* |
| Ex. 13 | Nd | Ti | 1.20 | 0.8 | 9 |

According to Table 2, the tan δ was 10% or less in Example 11, where "a/b" was larger than 1, while the tan δ exceeded 10% in Comparative Example 11, where "a/b" was 1 or less.

Experimental Example 3

Example 21 and Comparative Examples 21 and 22 were obtained by changing the value of "n" of Example 1 (n=0.8). The results are shown in Table 3.

TABLE 3

|  | A-site | B-site | a/b | n | tan δ (%) |
|---|---|---|---|---|---|
| Comp. Ex. 21 | Sr | Ta | 1.1 | *0.5* | *40* |
| Comp. Ex. 22 | Sr | Ta | 1.1 | *0.6* | *18* |
| Ex. 21 | Sr | Ta | 1.1 | 0.7 | 4 |
| Ex. 1 | Sr | Ta | 1.1 | 0.8 | 1 |

According to Table 3, examples satisfying n≥0.7 had tan δ of 10% or less and were a polycrystalline dielectric thin film with excellent dielectric loss, while tan δ exceeded 10% and deteriorated in Comparative Examples 21 and 22, where n<0.7 was satisfied.

When n<0.7 was satisfied, it is presumed that tan δ deteriorated because the structure where the Ta—N chains were connected in a zigzag manner was not sufficiently formed.

DESCRIPTION OF THE REFERENCE NUMERALS

1 . . . thin film capacitor
11 . . . substrate
12 . . . lower electrode
13 . . . polycrystalline dielectric thin film
14 . . . upper electrode

The invention claimed is:

1. A polycrystalline dielectric thin film, comprising a main component of a perovskite-type oxynitride, wherein the perovskite-type oxynitride is represented by a composition formula of $A_aB_bO_oN_n$ (a+b+o+n=5), a/b>1 and n≥0.7 are satisfied, and the polycrystalline dielectric thin film has tan δ of 10% or less.

2. The polycrystalline dielectric thin film according to claim 1, wherein "A" is one or more elements selected from Sr, Ba, Ca, La, Ce, Pr, Nd, and Na, and "B" is one or more elements selected from Ta, Nb, Ti, and W.

3. The polycrystalline dielectric thin film according to claim 1, comprising an octahedron structure of $BO_4N_2$, wherein an arrangement of N in the octahedron structure is cis-type.

4. The polycrystalline dielectric thin film according to claim 2, comprising an octahedron structure of $BO_4N_2$, wherein an arrangement of N in the octahedron structure is cis-type.

5. A capacitor element comprising the polycrystalline dielectric thin film according to claim 1.

6. A capacitor element comprising the polycrystalline dielectric thin film according to claim 2.

7. A capacitor element comprising the polycrystalline dielectric thin film according to claim 3.

8. A capacitor element comprising the polycrystalline dielectric thin film according to claim 4.

* * * * *